United States Patent
Jaisimha et al.

(10) Patent No.: US 8,064,857 B2
(45) Date of Patent: Nov. 22, 2011

(54) METHOD AND APPARATUS FOR CO-CHANNEL INTERFERENCE DETECTION IN A RADIO

(75) Inventors: Shree Jaisimha, Senoia, GA (US); Tatsuya Fujisawa, Atlanta, GA (US); Mohammed Reza Kanji, Dearborn, MI (US)

(73) Assignee: Panasonic Automotive Systems Company of America, division of Panasonic Corporation of North America, Peachtree City, GA (US)

( * ) Notice: Subject to any disclaimer, the term of this patent is extended or adjusted under 35 U.S.C. 154(b) by 492 days.

(21) Appl. No.: 12/316,696

(22) Filed: Dec. 15, 2008

(65) Prior Publication Data

US 2010/0151809 A1    Jun. 17, 2010

(51) Int. Cl.
*H04B 1/18* (2006.01)
(52) U.S. Cl. ............... 455/150.1; 455/179.1; 455/188.1; 455/67.13

(58) Field of Classification Search .................. None
See application file for complete search history.

(56) References Cited

U.S. PATENT DOCUMENTS

| | | | | |
|---|---|---|---|---|
| 6,131,031 | A * | 10/2000 | Lober et al. | 455/444 |
| 6,400,393 | B1 * | 6/2002 | Limberg | 348/21 |
| 6,493,544 | B1 * | 12/2002 | Baxley et al. | 455/161.1 |
| 2008/0088736 | A1 * | 4/2008 | Bouillet | 348/470 |
| 2008/0108365 | A1 * | 5/2008 | Buddhikot et al. | 455/452.1 |
| 2010/0029235 | A1 * | 2/2010 | Bouillet | 455/226.2 |

* cited by examiner

*Primary Examiner* — Long Nguyen
(74) *Attorney, Agent, or Firm* — Laurence S. Roach

(57) ABSTRACT

A method of configuring a tuner includes sampling a radio frequency and measuring at least one signal quality metric for the sampled frequency. It is determined whether there is co-channel interference on the sampled frequency based on the measurement of the at least one signal quality metric. The sampled frequency is selected as an operational frequency for the tuner if it was determined in the determining step that there is an absence of co-channel interference on the sampled frequency.

20 Claims, 4 Drawing Sheets

METHOD AND APPARATUS FOR CO-CHANNEL INTERFERENCE DETECTION IN A RADIO

BACKGROUND OF THE INVENTION

1. Field of the Invention

The present invention relates to methods for operating radios for use in vehicles, and, more particularly, to methods for avoiding tuning into frequencies having poor signal quality in radios for use in vehicles.

2. Description of the Related Art

Co-channel interference in radio head units occurs when two or more stations with different audio content broadcast on the same frequency. Co-channel interference may be more likely to occur in adverse weather conditions (e.g., high pressure weather conditions) in which signals that would normally exit through the atmosphere instead get reflected back down to earth by the troposphere. This in particular applies to Amplitude Modulated (AM) signals. Co-channel interference may also occur due to poor network frequency planning by broadcasters, resulting in re-use of frequencies in a localized area.

The difficulty presented by co-channel interference is how to properly recognize the co-channel situation and avert it in a radio head unit. Aftermarket and OEM DSP chip solutions for radio head units support co-channel detection logic for only AM and not FM. This can explain why many OEM and aftermarket radios currently in the market exhibit an inability to recognize co-channel interference during normal operations like FM Autoseek and FM station list update.

FM Autoseek involves jumping to frequencies in the spectrum starting from a presently tuned-in station until a station is reached that meets criteria for acceptable field strength. FM Station list is a feature where the tuner scans the entire band and populates a station list with stations that meet the quality criteria, such as field strength. Co-channel interference negatively affects the listening audio quality experience by radio head unit end users, especially during FM radio operations, such as FM Station List and FM Autoseek operations.

A model FM MPX signal is shown in FIG. 1. Here it is noted that the stereo signal consists of signals bandlimited to 15 kHz. The FM MPX signal is backward compatible with FM mono receivers such that the mono receivers will only utilize the baseband (L+R). Stereo FM decoders however utilize both the baseband (L+R) and the (L−R) components which are double side band modulated about the 38 kHz carrier. For example, in Europe the frequency deviation is typically +/−22.5 kHz. When combined with the modulated audio (up to ±15 kHz), this translates to 37.5 kHz peak deviation, or 75 kHz (37.5 kHz doubled) when considering both negative and positive modulation about the carrier frequency, which is in accordance with the 100 kHz frequency step in European countries. Likewise, in the United States where the deviation is +/−75 kHz, this adds up to 75 kHz+15 kHz=90 kHz peak deviation, or 180 kHz (90 kHz doubled) when considering both negative and positive modulation about the carrier frequency, which is in accordance with the 200 kHz spacing between stations in the United States.

When a radio head unit is tuned to a frequency having co-channel interference, the FM MPX signal is tainted due to having two separate signals riding on each other, i.e., superimposed on each other. Each of the two signals has a separate audio content, which results in the decoder misconstruing the signal as having severe multipath and ultrasonic noise. However, the characteristic phenomenon that arises both in the laboratory and in the field is that co-channel interference results in high field strength (typically above 40 dBuV), but the signal is tainted in that the signal has high multipath and/or ultrasonic noise due to the destruction of the FM MPX signal.

The above-described co-channel interference scenario is different from normal cases of multipath wherein the field strength varies in accordance with the multipath's destructive and constructive effects. In the case of co-channel interference, the field strength experiences constructive superimposition and the signal exhibits high multipath activity since the FM MPX signal is "destroyed".

Accordingly, what is neither anticipated nor obvious in view of the prior art is a method of avoiding tuning into an FM frequency on which co-channel interference is present.

SUMMARY OF THE INVENTION

The present invention provides a method for the radio head unit to recognize and avoid co-channel interference and in turn enhance the listening quality experience of the radio head unit user.

The invention comprises, in one form thereof, a method of configuring a tuner, including sampling a radio frequency and measuring at least one signal quality metric for the sampled frequency. It is determined whether there is co-channel interference on the sampled frequency based on the measurement of the at least one signal quality metric. The sampled frequency is selected as an operational frequency for the tuner if it was determined in the determining step that there is an absence of co-channel interference on the sampled frequency.

The invention comprises, in another form thereof, a method of configuring a tuner, including sampling a radio frequency, and measuring multipath, ultrasonic noise, and field strength for the sampled frequency. It is determined that there is co-channel interference on the sampled frequency based upon the field strength being above a threshold value, and a combination of the multipath measurement and the ultrasonic noise measurement. The sampled frequency is selected as an operational frequency for the tuner if it was determined in the determining step that there is an absence of co-channel interference on the sampled frequency.

The invention comprises, in yet another form thereof, a method of configuring a tuner, including sampling a radio frequency, and measuring at least one signal quality metric for the sampled frequency. It is determined whether there is co-channel interference on the sampled frequency based on the measurement of the at least one signal quality metric. If it was determined in the determining step that there is co-channel interference on the sampled frequency, then the sampled frequency is rejected as a stop on an FM Autoseek operation, the sampled frequency is rejected as a frequency on a list of pre-set frequencies, and/or the sampled frequency is automatically tuned out and another frequency is automatically tuned in.

An advantage of the present invention is that the radio is able to determine when co-channel interference is present on a frequency and avoid tuning into that frequency.

Another advantage is that the invention may assist the Auto Seek operation by making the tuner more selective in the frequencies it will stop at in the Auto Seek operation. Particularly, the invention may assist in averting false stops at frequencies with co-channel interference, thereby enhancing the user listening experience.

Yet another advantage is that the application of the invention can be extended to provide improved selectivity for additional features requested by OEM customers such as Autostore Presets and dynamic station lists. For example, Autostore is a feature which may require the radio to scan the entire spectrum and store the twelve best frequencies onto RAM in order for the frequencies to be recalled by the user when needed. Thus, only frequencies with high quality audio content and without co-channel interference may be populated.

A further advantage is that if a user is listening to a station during long travel and the signal from another station on the same frequency begins to also be at least partially received, the radio can automatically detect the co-channel interference and embark on, for example, a Program-Type Seek operation to tune in a frequency without co-channel interference.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

In one embodiment, the method of the present invention is used in conjunction with a digital signal processor (DSP) that can handle baseband frequency signals coming from a tuner IC that feeds in an IF (Intermediate Frequency) at 10.7 MHz which can demodulate FM. The front-end DSP, in addition to demodulating the signal, may perform field strength analysis, multipath and ultrasonic noise determination.

Field strength measurements provide an indication of the quality of signal reception and help determine whether the radio station has good signal coverage in the vicinity of the user.

Although the signal can have high field strength, it can still be subject to being reflected and/or deflected by trees and tall buildings. The degree of such reflections and/or deflections is a parameter known as "multipath", which affects reception quality.

Figure 1:
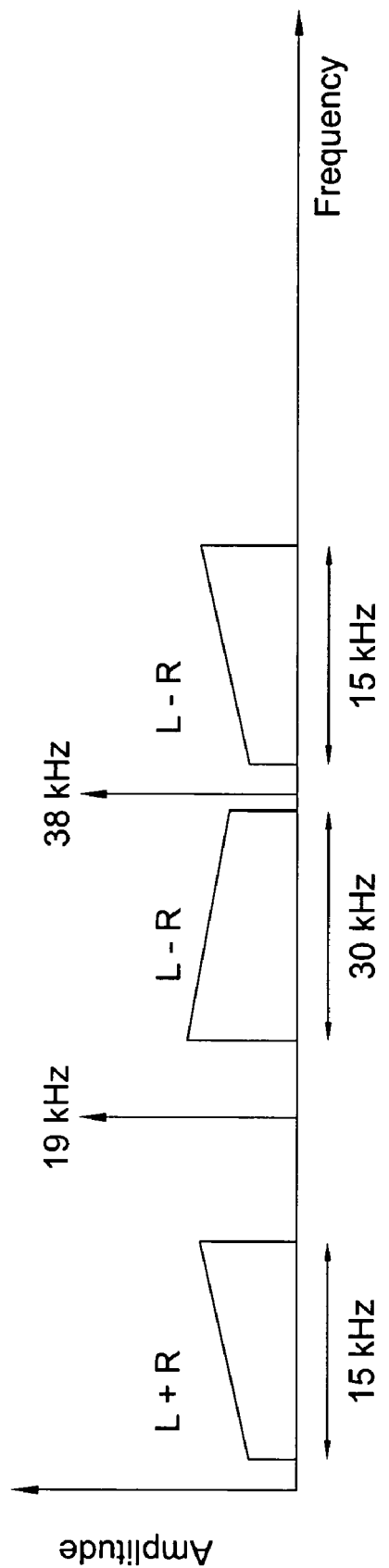
FIG. 1 is a plot of the frequency profile of a model FM MPX signal.
Figure 2A:
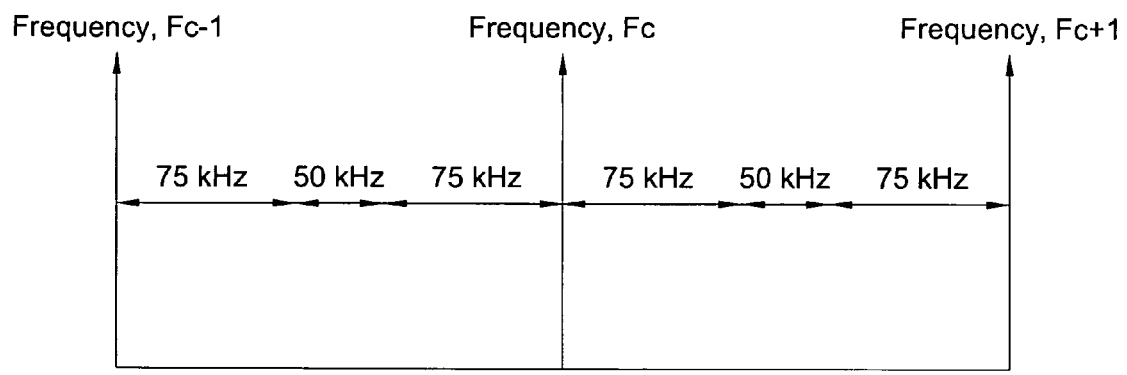
FIG. 2a is a diagram of adjacent FM radio frequencies in the United States tuner region.
Figure 2B:
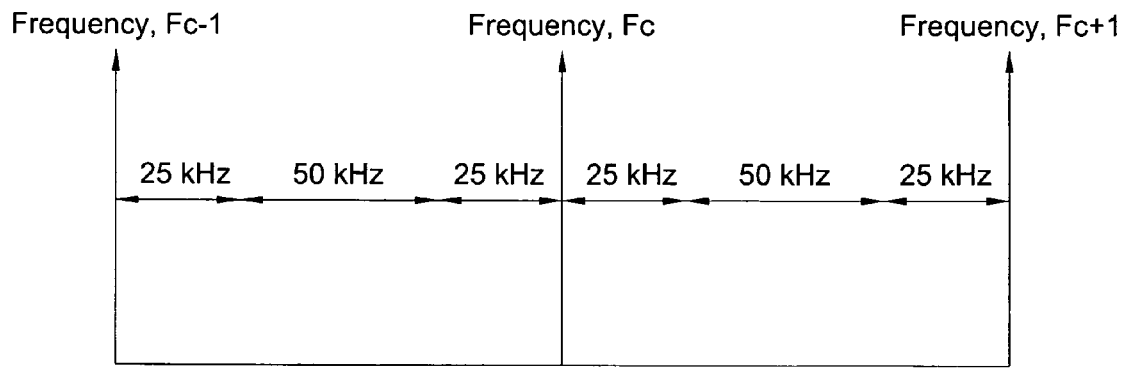
FIG. 2b is a diagram of adjacent FM radio frequencies in the Europe and Japan tuner region.

Radio stations can sometimes overmodulate their signal, leading to adjacent channel interference known as "ultrasonic noise." For example, in the U.S., FM frequencies are spaced apart 200 kHz, as shown in FIG. 2a. There are instances when a radio station overmodulates its signal past the 75 kHz modulation and beyond the allowed 25 kHz guard band, which leads to the station being heard on an adjacent station that is being tuned to. Ultrasonic noise is typically identified by the DSP if it detects harmonics past the 150 kHz band after IF demodulation. Similarly, in Europe and Japan, FM frequencies are spaced apart 100 kHz, as shown in FIG. 2b. There are instances when a radio station overmodulates its signal past the 25 kHz modulation and beyond the allowed 25 kHz guard band.

Figure 3:
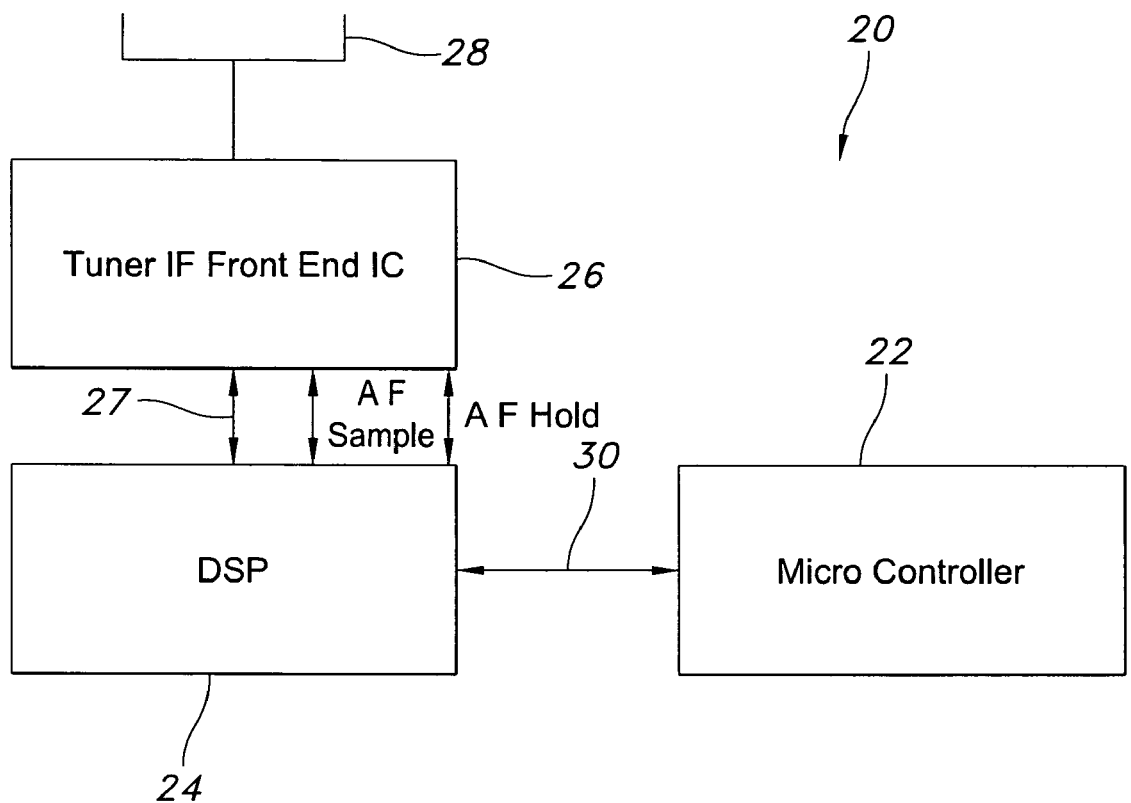
FIG. 3 is a block diagram illustrating one embodiment of a radio system of the present invention.

Referring now to FIG. 3, there is shown one embodiment of a radio tuner system 20 of the present invention including a microcontroller 22 that may be used to process user input. A digital signal processor (DSP) 24 may be used to provide audio demodulation of the air-borne IF input signal. DSP 24 may also be used to provide quality information parameters to the main microcontroller 22 via a serial communication protocol such as I2C. The quality information parameters may include multipath, adjacent channel noise, and field strength. DSP 24 may rely on a Tuner IC 26 to perform the front end RF demodulation and the gain control. Tuner IC 26 may also output the Intermediate Frequency to DSP 24 where the Intermediate Frequency may be demodulated and processed. Tuner IC 26 may further provide a gain to the IF (Intermediate Frequency) of up to 6 dBuV prior to forwarding the signal to DSP 24. Communication between Tuner IC 26 and DSP 24, as indicated at 27, may be via a serial communication protocol such as I2C, which may operate at 400 kbps.

An antenna system 28 may be communicatively coupled to Tuner IC 26. Antenna system 28 may be in the form of a passive mast, or an active mast of phase diversity, for example.

DSP 24 may provide signal quality parameterization of demodulated tuner audio and may make it available to microcontroller 22 via a serial bus 30. In one embodiment, serial communication bus 30 is in the form of a 400 kbps high speed I2C.

The signal parameterization may include field strength, multipath and ultrasonic noise. Field strength may give an indication of signal reception and may help determine whether the radio station has good signal coverage in the vicinity of the user.

Although the signal can have high field strength, it can be subject to reflections which can arise from trees and tall building which reflect/deflect the signal. The multipath parameter may enable the level of multipath to be ascertained, and may affect reception quality.

Many times stations can overmodulate their signal leading to adjacent channel interference. For example, in the U.S., FM frequencies are spaced apart 200 kHz. Adjacent channel interference can lead to ultrasonic noise in cases where a neighboring station that is next to a currently listened-to station has a high field strength. The high field strength may result in the neighbor station's spectrum overlapping with that of the currently listened-to station, thereby causing audio distortion. Ultrasonic noise may typically be detected by the DSP if the DSP detects harmonics past the 150 kHz band after IF demodulation.

A novel feature of the present invention is the identification of co-channel interference by performing a quality check on the frequency in question to determine whether its FM MPX signal has been tainted by co-channel interference. When a radio head unit is tuned to a frequency experiencing co-channel interference, the FM MPX signal is tainted such that each of the two competing stations' signals ride, or are superimposed, on each other. Each of the two signals has a separate audio content, which results in the decoder misconstruing the signal as having severe multipath and/or ultrasonic noise.

In one embodiment of the present invention, co-channel interference is identified as a result of detecting in the signal the trademark characteristics of high field strength (i.e., typically above 40 dBuV), and high multipath and/or ultrasonic noise due to the destruction of the FM MPX signal.

In order to determine the signal quality, a three-dimensional quality table may be employed which includes the three parameters of field strength, multipath and ultrasonic noise as inputs. In a particular embodiment, the field strength in the quality table is provided at 5 dBuV increments, while the multipath and ultrasonic values are provided with, or quantized by, a one percent resolution. The multipath and ultrasonic parameters may be quantized based on the scaling (levels 0 to 3).

During the FM Station List Update and FM Autoseek operations, the algorithm to find the best frequencies may involve performing three quality checks (i.e., field strength, multipath and ultrasonic noise) and inputting these values into the FM quality table. Any frequency that has field strength greater or equal to a threshold value (40 dBuV in a specific embodiment) but poor quality may be deemed as a frequency having co-channel interference, and thus the frequency may be skipped as a candidate for inclusion in the FM Station List or as a stop in the FM Autoseek operation.

In one embodiment, the invention employs a perceptually weighted FM Quality Table. In order to allow for this, the FM Quality table may utilize perceptual weighting based on quality parameters. The perceptually weighted checks may take advantage of the poor signal reception of the presently listened-to station to perform checks.

In one embodiment, the perceptual filter that is utilized includes a three-dimensional fraction which inputs field strength, multipath and ultrasonic noise and outputs a quality factor. The three parameters may be received from the DSP through auto increment registers.

In one embodiment, the parameters of field strength, multipath and ultrasonic noise as read from the DSP all lie in a normalized range with values ranging from 0 to 100. Creating and storing a 100 by 100 by 100 quality table of values would consume an excessive amount of ROM memory in the microcontroller. Operating at full scale of 100% is not required because distortion of audio is usually perceived at a range from 0 to 25%. Based on empirical listening tests, it has been found that grouping the scale value within segments in the 0 to 25% range may be most efficient because, from the user's point of view, no difference may be perceived between distortion at 24% and distortion at 25%. As an example of normalizing multipath and ultrasonic noise from the DSP, this 0 to 25% range may be broken down into a level of 0, 1 or 2 for each of the parameters as follows:

Level 0 for Multipath—contains multipath values from 0 to 10%.
Level 1 for Multipath—contains multipath values from 11 to 20%.
Level 2 for Multipath—contains multipath values from 20 to 25%.

Similarly, for ultrasonic noise, the 0 to 25% range may be broken down into a level of 0, 1 or 2 in the following manner:

Level 0 for Ultrasonic Noise—contains ultrasonic noise values from 0 to 15%.
Level 1 for Ultrasonic Noise—contains ultrasonic noise values from 15 to 20%.
Level 2 for Ultrasonic Noise—contains ultrasonic noise values from 20 to 25%.

In one embodiment, the ranges are calibratable. Field strength may be the most important parameter in the quality table because it is proportional to the strength of reception. Field strength may be normalized to units of 5 dBuV and may have an upper level cap of 80 dBuV, resulting in sixteen possible field strength values.

Thus, the size of the quality table may be set at sixteen field strength values by three multipath values by three ultrasonic noise values. However, these table size parameters may be calibratable. The quality table may vary based on the antenna type used by the vehicle, namely, a passive antenna, an active antenna or a diversity antenna. The reason the quality table may vary by antenna type may be due to the fact that a diversity antenna is more robust to multipath and to adjacent effects because it switches earlier to a better antenna as compared to active and passive antenna.

Figure 4:
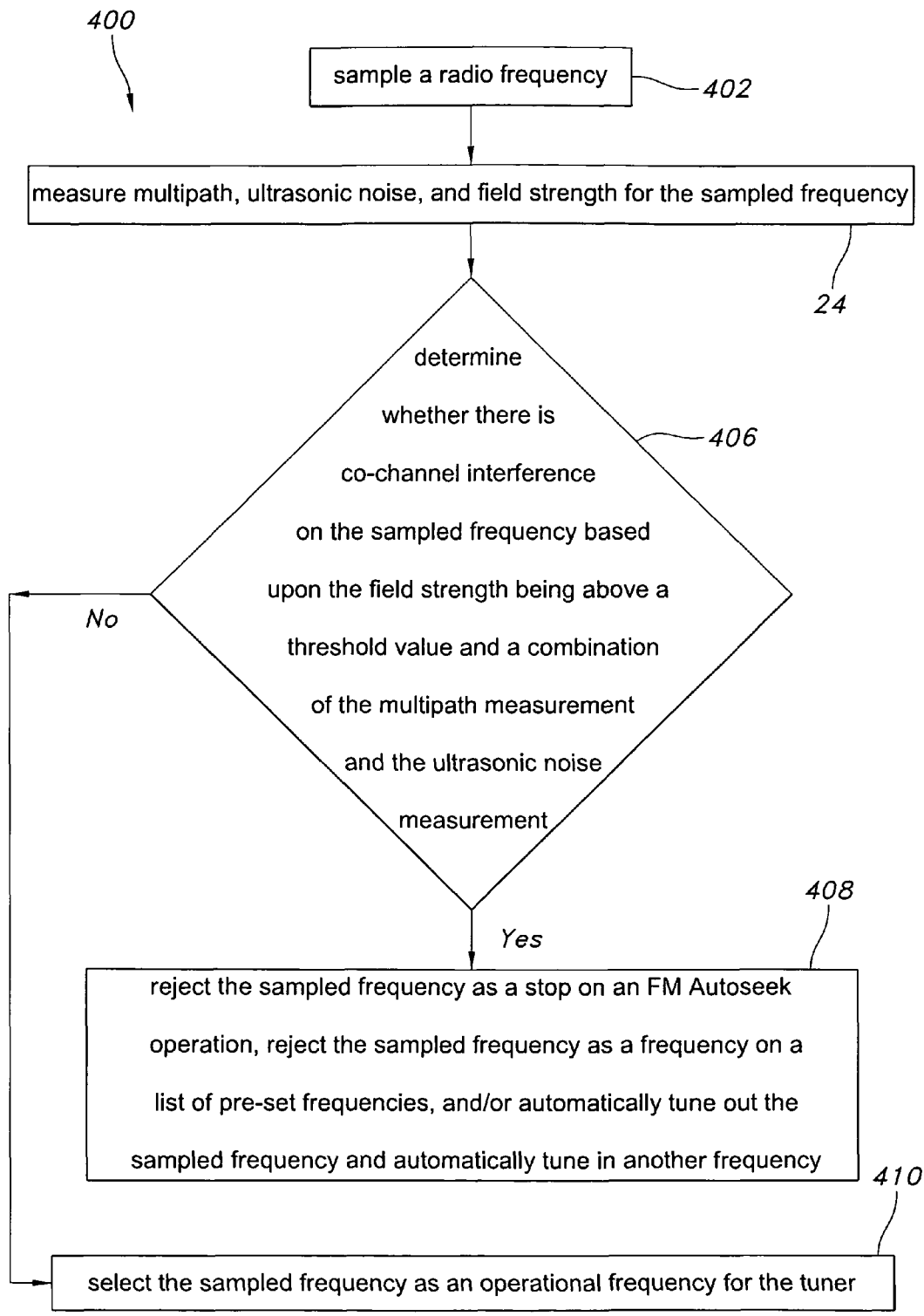
FIG. 4 is a flow chart of one embodiment of a method of the present invention for performing quality checks.

One embodiment of a method 400 of the present invention for configuring a tuner is illustrated in FIG. 4. In a first step 402, a radio frequency is sampled. In one embodiment, a frequency in the FM band is automatically tuned into by an FM radio receiver.

In step 404, multipath, ultrasonic noise and field strength are measured for the sampled frequency. In a next step 406, it is determined whether there is co-channel interference on the sampled frequency based upon the field strength being above a threshold value and a combination of the multipath measurement and the ultrasonic noise measurement. In one embodiment, it is determined that there is co-channel interference on the sampled frequency if the field strength valued is at least 40 dBuV and the combination of the multipath measurement and the ultrasonic noise measurement is indicative of poor signal quality. A lookup table may be utilized to determine which combinations of multipath and ultrasonic noise values are indicative of poor signal quality and which are not.

If it is determined in step 406 that there is co-channel interference on the sampled frequency, then operation proceeds to step 408 wherein the sampled frequency is rejected as a stop on an FM Autoseek operation, the sampled frequency is rejected as a frequency on a list of pre-set frequencies, and/or the sampled frequency is automatically tuned out and another frequency is automatically tuned into.

If, however, it is determined in step 406 that there is not co-channel interference on the sampled frequency, then operation proceeds to step 410 wherein the sampled frequency is selected as an operational frequency for the tuner. For example, the sampled frequency may be accepted as a stop on an FM Autoseek operation, the sampled frequency may be accepted as a frequency on a list of pre-set frequencies, and/or the sampled frequency may automatically continue to be tuned into.

According to a particular embodiment of the present invention, during the FM Station List Update and FM Autoseek operations, the algorithm to identify the best frequencies involves performing three quality checks (field strength, multipath and ultrasonic noise) and inputting these values into the FM quality table. Any frequency that has a field strength greater or equal to 40 dBuV (a calibratable value) but poor quality may be deemed as a frequency having co-channel interference, and thus may be skipped as a candidate for the FM Station List and as a stop in the FM Autoseek operation.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of configuring a tuner, comprising the steps of:
sampling a radio frequency;
measuring at least one signal quality metric for the sampled frequency;

determining whether there is co-channel interference on the sampled frequency based on the measurement of the at least one signal quality metric, the determining step comprising ascertaining that there is co-channel interference on the sampled frequency based upon a field strength being above a threshold value and a measurement of at least one of multipath and ultrasonic noise; and selecting the sampled frequency as an operational frequency for the tuner if it was determined in the determining step that there is an absence of co-channel interference on the sampled frequency.

2. The method of claim 1 comprising the further steps of:
repeating the sampling, measuring and determining steps for a plurality of frequencies; and
selecting a set of operational frequencies for the tuner, said selecting being dependent upon the determining steps.

3. The method of claim 2 wherein the step of selecting a set of operational frequencies includes selecting a set of operational frequencies to maximize a number of broadcast stations from which the tuner may receive signals of an acceptable quality.

4. The method of claim 1 wherein the at least one signal quality metric is dependent upon at least one of field strength, level of multipath, and ultrasonic noise.

5. The method of claim 1 comprising the further step of rejecting the sampled frequency as an operational frequency for the tuner if it was determined in the determining step that there is co-channel interference on the sampled frequency.

6. The method of claim 5 wherein the rejecting step comprises
automatically tuning out the sampled frequency and automatically tuning in another frequency.

7. A method of configuring a tuner, comprising the steps of:
sampling a radio frequency;
measuring multipath, ultrasonic noise, and field strength for the sampled frequency;
determining that there is co-channel interference on the sampled frequency based upon:
the field strength being above a threshold value; and
a combination of the multipath measurement and the ultrasonic noise measurement; and
selecting the sampled frequency as an operational frequency for the tuner if it was determined in the determining step that there is an absence of co-channel interference on the sampled frequency.

8. The method of claim 7 comprising the further steps of:
repeating the sampling, measuring and determining steps for a plurality of frequencies; and
selecting a set of operational frequencies for the tuner, said selecting being dependent upon the determining steps.

9. The method of claim 8 wherein the step of selecting a set of operational frequencies includes selecting a set of operational frequencies to maximize a number of broadcast stations from which the tuner may receive signals of an acceptable quality.

10. The method of claim 7 comprising the further step of rejecting the sampled frequency as an operational frequency for the tuner if it was determined in the determining step that there is co-channel interference on the sampled frequency.

11. The method of claim 10 wherein the rejecting step comprises
automatically tuning out the sampled frequency and automatically tuning in another frequency.

12. The method of claim 7 wherein the determining step comprises determining that there is co-channel interference on the sampled frequency based upon:
the field strength being above a threshold value; and
a combination of the multipath measurement and the ultrasonic noise measurement indicating poor signal quality.

13. A method of configuring a tuner, comprising the steps of:
sampling a radio frequency;
measuring at least one signal quality metric for the sampled frequency;
determining whether there is co-channel interference on the sampled frequency based on the measurement of the at least one signal quality metric; and
if it was determined in the determining step that there is co-channel interference on the sampled frequency, then automatically tuning out the sampled frequency and automatically tuning in another frequency.

14. The method of claim 13 wherein the sub-step of automatically tuning out the sampled frequency and automatically tuning in another frequency includes automatically embarking on a Program-Type Seek operation in order to tune in another frequency.

15. The method of claim 13 comprising the further steps of:
repeating the sampling, measuring and determining steps for a plurality of frequencies; and
selecting a set of operational frequencies for the tuner, said selecting being dependent upon the determining steps.

16. The method of claim 15 wherein the step of selecting a set of operational frequencies includes selecting a set of operational frequencies to maximize a number of broadcast stations from which the tuner may receive signals of an acceptable quality.

17. The method of claim 13 wherein the at least one signal quality metric is dependent upon at least one of field strength, level of multipath, and ultrasonic noise.

18. The method of claim 17 wherein the determining step comprises determining that there is co-channel interference on the sampled frequency based upon the field strength being above a threshold value and a measurement of at least one of multipath and ultrasonic noise.

19. The method of claim 13 wherein the sampled frequency is repeatedly sampled while it is being listened-to before being automatically tuned out in the automatically tuning out substep.

20. The method of claim 18 wherein the threshold value is about 40 dBuV.

* * * * *